(12) United States Patent
Illegems et al.

(10) Patent No.: US 7,479,809 B2
(45) Date of Patent: Jan. 20, 2009

(54) LOW POWER THREE-LEVEL DETECTOR

(75) Inventors: Paul F. Illegems, Tucson, AZ (US);
Srinivas Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 149 days.

(21) Appl. No.: 11/536,241

(22) Filed: Sep. 28, 2006

(65) Prior Publication Data

US 2008/0079464 A1    Apr. 3, 2008

(51) Int. Cl.
*H03K 5/22*  (2006.01)
*H03K 5/153*  (2006.01)
(52) U.S. Cl. .......................................... 327/77; 327/74
(58) Field of Classification Search ............... 327/77, 327/74
See application file for complete search history.

(56) References Cited

U.S. PATENT DOCUMENTS

| | | |
|---|---|---|
| 4,282,601 A | 8/1981 | Flora |
| 4,714,877 A | 12/1987 | Kong |
| 5,629,921 A | 5/1997 | Eastman et al. |
| 5,705,944 A * | 1/1998 | Mou et al. ................. 327/74 |
| 5,708,625 A | 1/1998 | Sato et al. |
| 6,133,753 A * | 10/2000 | Thomson et al. ........... 326/56 |
| 6,812,752 B2 | 11/2004 | Lin |
| 6,885,215 B1 | 4/2005 | Hou et al. |
| 7,061,305 B2 | 6/2006 | Kim |
| 7,167,055 B2 | 1/2007 | Wong et al. |

* cited by examiner

*Primary Examiner*—Kenneth B Wells
*Assistant Examiner*—John W Poos
(74) *Attorney, Agent, or Firm*—Meyertons Hood Kivlin Kowert & Goetzel, P.C.; Jeffrey C. Hood

(57) ABSTRACT

A three-level detector circuit may comprise an input node and a pair of diode-connected transistors having respective drain terminals coupled to the input node. The pair of diode-connected transistors may be configured to set a voltage if the input voltage at the input node corresponds to an open input. The three-level detector circuit may further comprise a pair of inverting stages coupled to the input node, the pair of inverting stages configured to distinguish between low, high, and/or open inputs. The three-level detector circuit may also comprise a pair of latches, e.g. D-flip-flops, each of the pair of latches having a respective input coupled to a respective output of a respective one of the pair of inverting stages, and each of the pair of latches configured to latch a present state of the input in detection mode. In one set of embodiments, the three-level detector circuit is operable to cease conducting current after the present state of the input has been latched.

40 Claims, 3 Drawing Sheets

LOW POWER THREE-LEVEL DETECTOR

BACKGROUND OF THE INVENTION

1. Field of the Invention

This invention relates generally to voltage detector design and, more particularly, to the design of a three-level voltage detector.

2. Description of the Related Art

Comparators are devices that typically compare two voltages or two currents, switching their respective outputs to indicate which of the two input signals is larger. Oftentimes comparators are analog circuits used in a variety of applications. One implementation and use of comparators may be directed towards detecting the level of an input signal, for example an input voltage, relative to a designated reference level or multiple reference levels. Certain applications may call for voltage detectors that accurately detect a high voltage state (Vdd), a low voltage state (Gnd), and/or an open state on an IC (integrated circuit) pin.

Current solutions generally detect the high and the low states but require external components to detect the open state. Furthermore, the range of the open condition is typically static, and the detectors normally remain turned on, drawing supply current even after the input state has already been determined. A typical example of a three-level voltage detector 100 is shown in FIG. 1. Comparators 106 and 108 are used to check the level of input signal 120 against a high voltage 110 and a low voltage 112, respectively. As shown, input signal 120 may be present as one of several possible external connections that include Vdd, Gnd, or an intermediate voltage obtained from a voltage divider circuit comprising resistors 102 and 104. As seen in FIG. 1, external resistors (102 and 104) are required when operating voltage detector 100.

Other corresponding issues related to the prior art will become apparent to one skilled in the art after comparing such prior art with the present invention as described herein.

SUMMARY OF THE INVENTION

In one set of embodiments, a low power three-level detector circuit may comprise an accurate mechanism to detect a High (Vdd) state, Low (GND) and an open state of an IC-pin. The values corresponding to the detected states may be latched and stored in registers. The circuit may momentarily draw supply current at power-up, subsequently switching itself off after having latched the value corresponding to the detected input state. Detection of the open state by the low power three-level detector circuit may be based on an internally generated voltage, obviating the need for external components that are typically required by most current solutions to detect the third state. Furthermore, the range for the open condition may be adjusted by sizing select devices within the circuit.

In one set of embodiments, a three-level detector circuit guarantees correct detection of the High, Low and Open inputs. By using matching devices, the trip levels of the three-level detector circuit may be accurately defined. External components may not be required, even to detect the Open inputs. The "Open" detection may be based on an internally generated voltage with no external resistors required. In one embodiment, the three-level detector circuit draws supply current only for a very short time, e.g. at power up, and may be operated to conduct zero current after latching in a detected state. The three-level detector circuit may also be operated to turn itself off, enabling application in battery-powered systems. Sampling the input state may be performed at power-up, or at other specified times. An input pin configured for providing the input into the three-level detector circuit may be used for other functions (e.g. as an output or input) after initial detection has been performed.

In one embodiment, a three-level detector circuit may comprise an input node and a pair of diode-connected transistors having respective drain terminals coupled to the input node. The pair of diode-connected transistors may be configured to set a voltage if the input voltage at the input node corresponds to an open input. The three-level detector circuit may further comprise a pair of inverting stages coupled to the input node, with the pair of inverting stages configured to distinguish whether the voltage input is low, high, and/or open. The three-level detector circuit may also comprise a pair of latches, e.g. D-flip-flops, with each of the pair of latches having a respective input coupled to a respective output of a respective one of the pair of inverting stages, and each of the pair of latches configured to latch a present state of the input when in detection mode. In one set of embodiments, the three-level detector circuit is operable to cease conducting current after the present state of the input has been latched.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
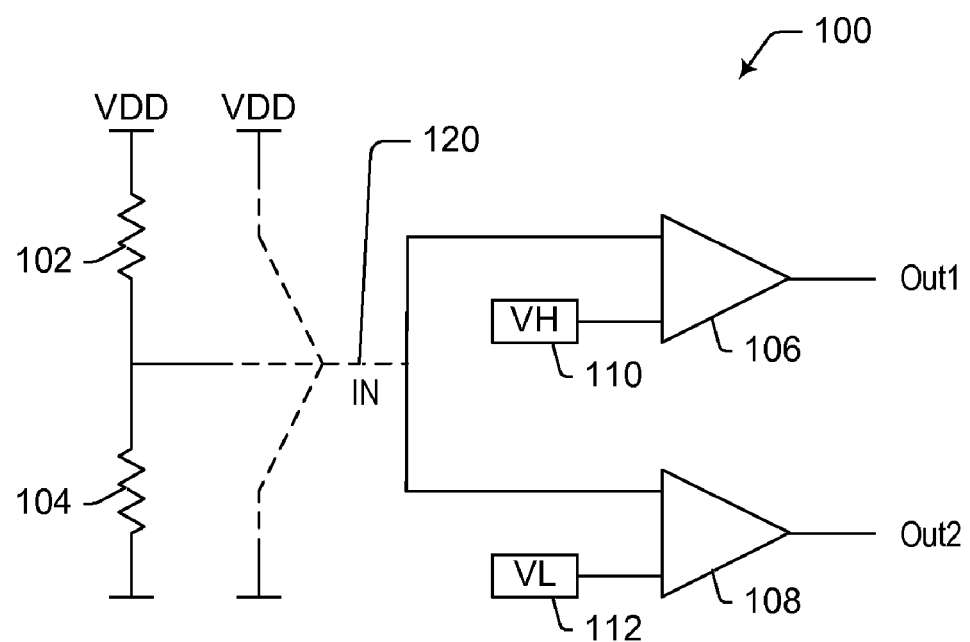
FIG. 1 shows one embodiment of a three-level detector circuit according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

Figure 2:
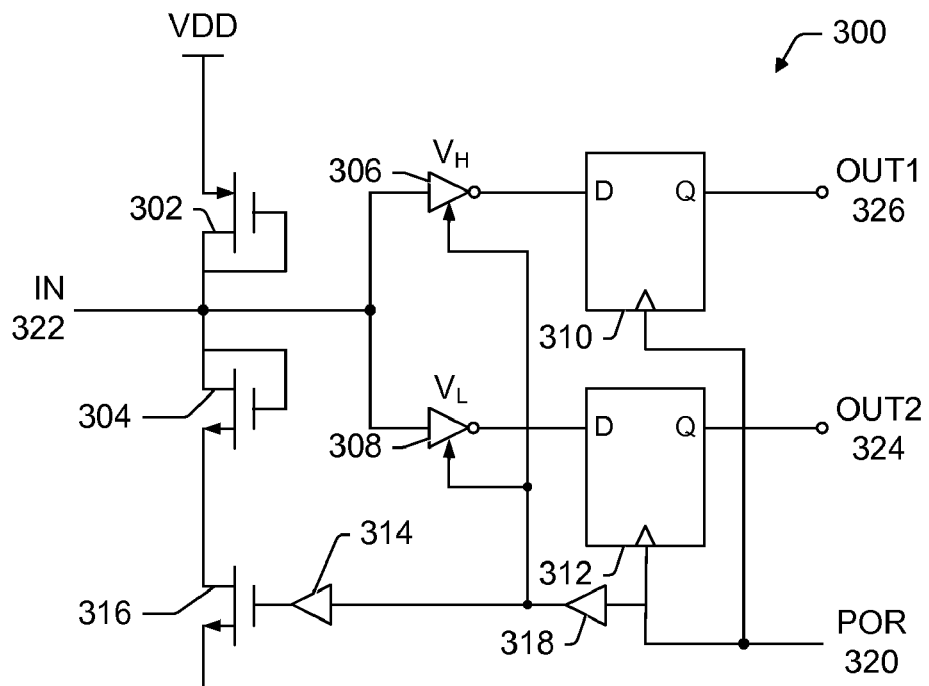
FIG. 2 shows a logic diagram of one embodiment of a low power three-level detector configured with D-flip-flops.

FIG. 2 shows one embodiment of a low power three-level detector circuit 300 configured with DFFs (D-flip-flops) and inverters. Operation of detector circuit 300 may be initiated via power on reset (POR) signal 320. In one set of embodiments, outputs OUT1 326 and OUT2 324 may be configured to assert and de-assert based on the value of input signal IN 322—following POR—as follows:

If IN 322 is less than a low threshold voltage $V_L$, then OUT1 326 and OUT2 324 may both be asserted (turned on; logic 1).

If IN 322 is open, that is, it is neither less than $V_L$ nor higher than a high threshold voltage $V_H$ (also considered an "open" condition), then OUT1 326 may be asserted (turned on; logic 1) and OUT2 324 may be de-asserted (turned off; logic 0).

If IN 322 is higher than $V_H$, then OUT1 326 and OUT2 324 may both be de-asserted (turned off; logic 0).

In alternate embodiments, the behavior of OUT1 326 and OUT2 324 may be configured differently with respect to the three different groups of input values of IN 322 discussed above. One alternate configuration will be shown in FIG. 3, and will be further discussed below.

As shown, circuit 300 may comprise a diode-connected PMOS transistor 302 and a diode-connected NMOS transistor 304, which may set a voltage in case of an "open" condition (second of the three conditions described above). Matched inverting stages 306 and 308 may help distinguish between low, high and/or open inputs. As shown, inverter 306 may be configured as high trip point $V_H$, and inverter 308 may be configured as low trip point $V_L$. When POR is asserted (logic 0, in the embodiment shown), circuit 300 may evaluate the input level of IN 322. When POR is de-asserted (logic 1, in the embodiment shown), the state of the input level of IN 322 may be latched in by DFFs 310 and 312 (which, in alternate embodiments, may be replaced with any one or more of a variety of latches and/or flip-flops operating as memory elements in a manner similar as shown in FIG. 2), with the de-asserted POR signal 320 subsequently operating to turn off all supply current.

Figure 3:
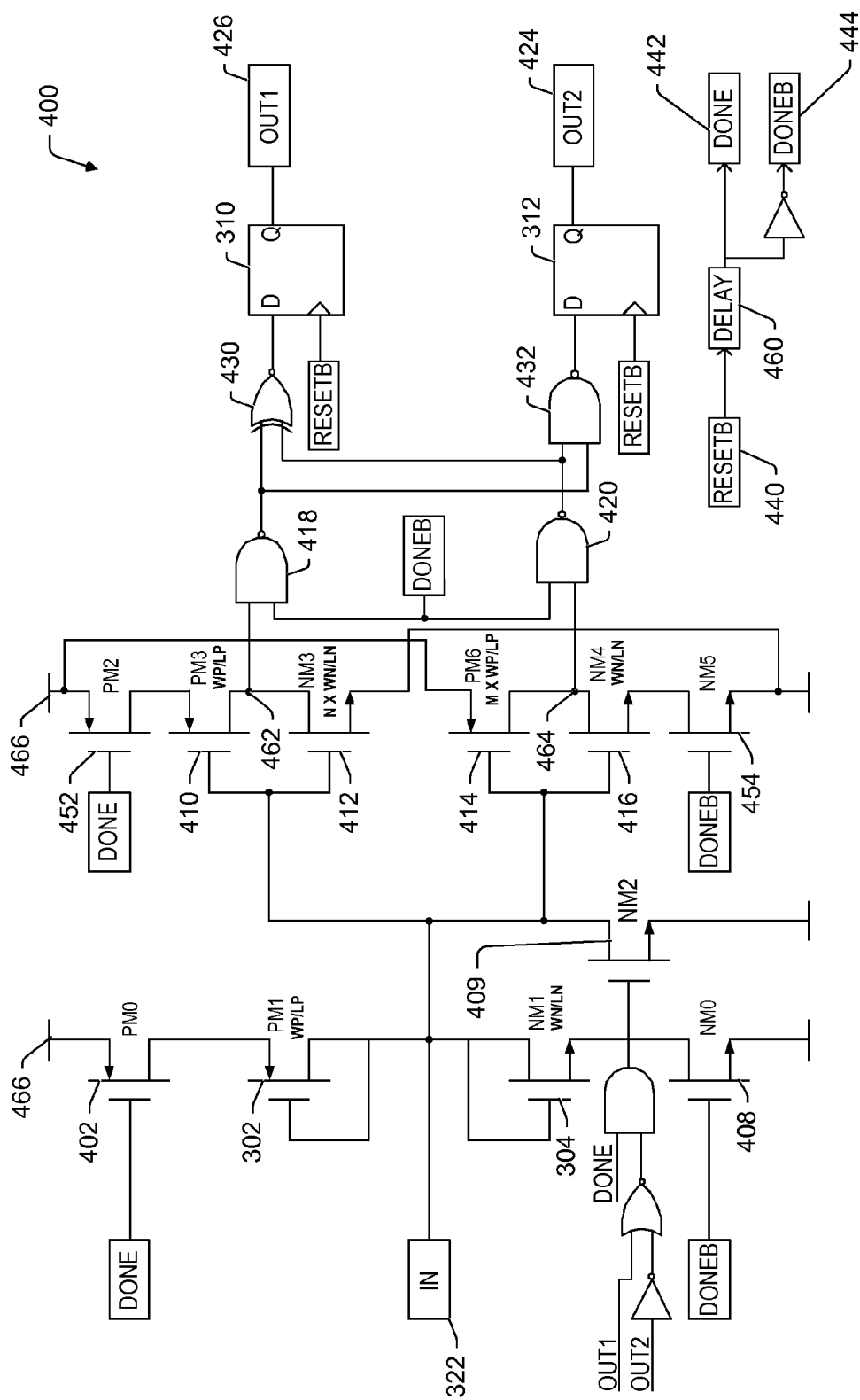
FIG. 3 shows a circuit diagram of one embodiment of a three-level detector configured with D-flip-flops.

FIG. 3 shows a circuit diagram of one embodiment 400 of three-level detector circuit 300 shown in FIG. 2, with the behavior of OUT1 426 and OUT2 424 modified with respect to the behavior of corresponding outputs OUT1 326 and OUT2 324 in FIG. 2. In other words, in this embodiment, logic has been added to modify the behavior of OUT1 426 and OUT2 424 based on the three different groups of input values of IN 322 when compared to the behavior of OUT1 326 and OUT2 324 based on the same groups of input values of IN 322.

In one embodiment, the operation of circuit 400 is controlled by input RESETB 440, which may be derived from the power-on-reset of the logic, illustrated as POR signal 320 in FIG. 3. When RESETB 440 is low (logic 0 in the embodiment shown), circuit 400 may evaluate the input level of input signal IN 322. This may be referred to as the evaluation phase. Upon RESETB 440 going high (logic 1 in the embodiment shown), the state of input signal IN 322 (i.e. the input level of input signal IN 322) may be latched by DFFs 310 and 312, and after a specified delay 460, DONE signal 442 and DONEB signal 444—derived here from RESETB 440 as shown—may be used to turn off all supply current to circuit 400. This may be referred to as the detection phase, followed by the off phase.

In the detection phase, the voltage at input IN 322 may be determined mainly by PMOS device 302 and NMOS device 304. PMOS device 402 and NMOS device 408 may be operated as switches having very low impedance when turned on by the DONE signal (which is low, when RESETB is low) and DONEB signal (which is high, when RESETB is low), respectively. PMOS device 452 and NMOS device 454 may similarly act as switches, enabling inverter 306 (comprising PMOS device 410 and NMOS device 412) and inverter 308 (comprising PMOS device 414 and NMOS device 416), respectively. In preferred embodiments, NMOS devices 412 and 416 are matched with NMOS device 304, and PMOS devices 414 and 410 are matched with PMOS device 302.

During the condition when input signal IN 322 equals 0V or is less than the low trip point (or threshold voltage) $V_L$, nodes 462 and 464 will be high, resulting in outputs OUT1 426 and OUT2 424 also being set to high. During the condition when input signal IN 322 equals 1 (where in some embodiments 1 may be equivalent to supply voltage 466), or higher than the high trip point (or threshold voltage) $V_H$, nodes 462 and 464 will be low, resulting in outputs OUT1 426 and OUT2 424 being set to high and low, respectively.

In one set of embodiments, NMOS device 412 comprised in top inverter 306 may be designed to be N times stronger than NMOS device 304 (i.e. have a channel width-to-length ratio that is N times that of NMOS device 304), and also to be stronger than PMOS device 410 (i.e. have a higher channel width-to-length ratio than that of PMOS device 410). Similarly, PMOS device 414 may be designed to be M times stronger than PMOS device 302 (i.e. have a channel width-to-length ratio that is M times that of PMOS device 302), and also to be stronger than NMOS device 416 (i.e. have a higher channel width-to-length ratio than that of NMOS device 416). During the condition when input signal IN 322 is neither equal to 1 (or greater than $V_H$) nor equal to 0V (or less than $V_L$), it may be in an open state, or have a value between $V_L$ and $V_H$. In other words, IN 322 may be considered to be at an intermediate voltage level, leading to node 462 being driven to a low state due to NMOS device 412 being stronger than NMOS device 304 and PMOS device 410, and similarly, node 464 being driven high due to PMOS device 414 being stronger than PMOS device 302 and NMOS device 416. This may lead to outputs OUT1 426 and OUT2 424 to be driven to a low state and a high state, respectively. Matching NMOS devices 412 and 416 with NMOS device 304, and matching PMOS devices 414 and 410 with PMOS device 302 (as previously described) may result in robust operation with substantially reduced sensitivity to process parameter variations.

Referring again to the condition when the input signal IN 322 is in the open state, after latching in the state, NMOS device 409 may be turned on via DONE signal 442 and OUT1 426 and OUT2 424 fed back as shown, pulling input signal IN 322 to ground, thereby reducing the quiescent current and preventing the input at IN 322 from floating. A delay td to the gate of NMOS device 409 may be added to ensure that this transition happens after the value of the detected state of input signal IN 322 has been latched in DFFs 310 and 312. It should be noted that NMOS device 409 is an optional transistor included in the embodiment shown to prevent input IN 322 from floating in the off phase (i.e. after detection has been performed). However, if during the off phase input IN 322 is driven with a voltage value that is between $V_L$ and $V_H$ as opposed to being left floating, it is preferable to omit NMOS device 409 from circuit 400. Alternatively, if NMOS device 409 is included in circuit 400, it may be preferable to turn NMOS device 409 off for this condition.

Figure 4:
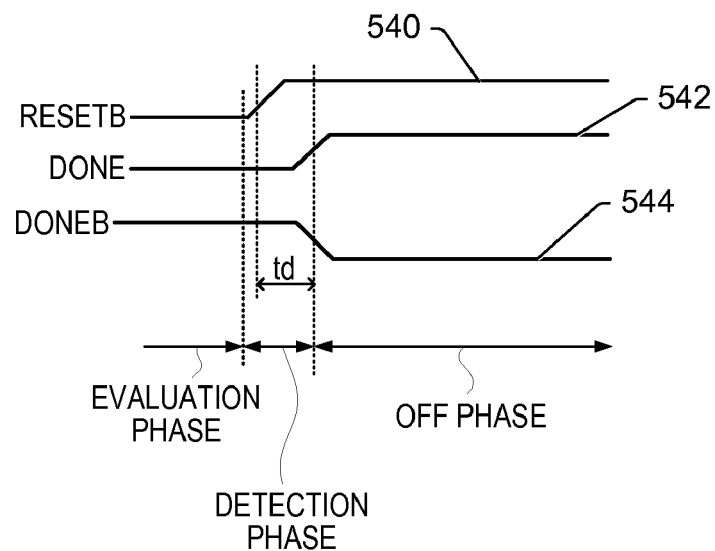
FIG. 4 shows a timing diagram for the Reset and various Done signals during operation of the three-level detector.

FIG. 4 shows a timing diagram with waveforms RESETB 540, DONE 542 and DONEB 544 for signals RESETB 440, DONE 442 and DONEB 444, respectively, during operation of three-level detector circuit 400. As shown, the evaluation phase occurs when RESETB is low (logic 0), followed by the detection phase as RESETB transitions to high (logic 1). The detection phase is followed by the off phase after a specified delay td, marked by RESETB remaining at a logic high level.

Referring again to FIG. 3, NAND gates 418 and 420 may be coupled to nodes 462 and 464 in order to avoid any crossbar current from supply 466. While nodes 462 or 464 may be floating during the off phase, there may be no current flowing in NAND gates 418 and 420, thereby preventing unknown states being propagated and/or latched into DFFs 310 and 312.

Circuit 400 may therefore be operated to correctly detect high, low and open inputs, with the trip levels of circuit 400 accurately defined using matching devices (e.g. matching PMOS devices 302, 410, 414, and matching NMOS devices 304, 412, 416. In addition, since the "open" detection is based on an internally generated voltage, no external components—such as external resistors—may be required. Circuit 400 may only draw supply current for a very short time, e.g. at power up, with zero current after latching in the detected state. In one embodiment, for example, circuit 400 may use 50 µA of current for a couple of µsecs during detection, and turn itself off, proving an ideal solution for application in battery powered systems. Sampling the input state may be performed at power-up, or at other times. As a result, any input pin used for IN 322 may also be used for other functions following initial detection (e.g. as an output or input).

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

We claim:

1. A system for detecting an input voltage level, the system comprising:
    an input node configured to receive an input signal;
    first and second diode-connected transistors having respective drain terminals coupled to the input node, wherein the first and second diode-connected transistors are operable to set an intermediate voltage at the input node when the input node is in an open state;
    first and second inverting stages having respective inputs coupled to the input node, wherein the first and second inverting stages are operable to provide an indication of a present state of the input node being one of:
        a high state for a high-level input signal,
        a low state for a low-level input signal, and
        an open state; and
    first and second latches having respective outputs, the first latch having an input coupled to an output of the first inverting stage and the second latch having an input coupled to an output of the second inverting stage, wherein the first and second latches are operable to latch the present state of the input node;
    wherein the system is operable to cease conducting current after the present state of the input node has been latched.

2. The system of claim 1, further comprising first and second logic gates, the first logic gate coupled between the output of the first inverting stage and the input of the first latch, and the second logic gate coupled between the output of the second inverting stage and the input of the second latch;
    wherein the first and second logic gates are configured to prevent current flow to the first and/or second latches in case the output of the first inverting stage and/or the output of the second inverting stage is/are floating.

3. The system of claim 1, further comprising one or more of:
    a first switching device having a first control input, wherein the first switching device is configured to enable the first diode-connected transistor according to the first control input;
    a second switching device having a second control input, wherein the second switching device is configured to enable the second diode-connected transistor according to the second control input;
    a third switching device having a third control input, wherein the third switching device is configured to enable the first inverting stage according to the third control input; and
    a fourth switching device having a fourth control input, wherein the fourth switching device is configured to enable the second inverting stage according to the fourth control input.

4. The system of claim 3, wherein the first, second, third, and fourth control inputs are derived from a power-on-reset signal used to power up the system.

5. The system of claim 1, wherein the present state of the input node is latched according to a control signal derived from a power-on-reset signal used to power up the system.

6. The system of claim 1, wherein the first inverting stage is configured to provide a high voltage trip point and the second inverting stage is configured to provide a low voltage trip point.

7. The system of claim 6, wherein:
    if the input signal is lower than the low voltage trip point, the latched present state of the input node is indicated by the output of the first latch being high and the output of the second latch being high;
    if the input node is open or the input signal is higher than or equal to the low voltage trip point and is lower than or equal to the high voltage trip point, the latched present state of the input node is indicated by the output of the first latch being low and the output of the second latch being high; and
    if the input signal is higher than the high voltage trip point, the latched present state of the input node is indicated by the output of the first latch being high and the output of the second latch being low.

8. The system of claim 6, wherein the first inverting stage comprises a first PMOS device and a first NMOS device, and the second inverting stage comprises a second PMOS device and a second NMOS device;
    wherein the first diode-connected transistor is a third PMOS device, and the second diode-connected transistor is a third NMOS device; and
    wherein the first NMOS device and the second NMOS device are each matched with the third NMOS device, and the first PMOS device and the second PMOS device are each matched with the third PMOS device, to accurately define the high voltage trip point and the low voltage trip point in relation to the intermediate voltage.

9. The system of claim 8, wherein a channel width-to-length ratio of the first NMOS device is a multiple of a channel width-to-length ratio of the third NMOS device, to drive the output of the first inverting stage low when the input node is at a voltage level that is higher than or equal the low voltage trip point and is lower than or equal to the high voltage trip point.

10. The system of claim 8, wherein a channel width-to-length ratio of the second PMOS device is a multiple of a channel width-to-length ratio of the third PMOS device, to drive the output of the second inverting stage high when the input node is at a voltage level that is higher than or equal the low voltage trip point and is lower than or equal to the high voltage trip point.

11. The system of claim 1, further comprising a third transistor having a channel terminal coupled to the input node, wherein the third transistor is configured to reduce quiescent current after the present state of the input node has been latched.

12. The system of claim 11, wherein the third transistor has a control terminal configured to receive a first control signal, wherein the first control signal is derived from the respective outputs of the first and second latches, wherein the control signal is operable to turn on the third transistor after the present state of the input node has been latched.

13. A system comprising:
a pin configured to receive an input signal; and
a detector circuit comprising:
    an input node coupled to the pin;
    first and second diode-connected transistors having respective drain terminals coupled to the input node, wherein the first and second diode-connected transistors are operable to set an intermediate voltage at the input node when the input node is open;
    first and second inverting stages having respective inputs coupled to the input node, wherein the first and second inverting stages are operable to provide an indication of a present state of the input node being one of:
    a high state for a high-level input signal,
    a low state for a low-level input signal, and
    an open state; and
    first and second latches having respective outputs, the first latch having an input coupled to an output of the first inverting stage and the second latch having an input coupled to an output of the second inverting stage, wherein the first and second latches are operable to latch the present state of the input node;
    wherein the detector circuit is operable to latch the present state of the input node according to a power-on-reset signal used to power up the system.

14. The system of claim 13, wherein the pin is configured to operate as one of:
an input pin,
an output pin, or
an input-output pin.

15. The system of claim 13, wherein the system is a battery powered system.

16. The system of claim 13, wherein the detector circuit is operable to cease drawing current after the present state of the input signal has been latched.

17. A system for detecting an input voltage level, the system comprising:
an input node configured to receive an input signal;
first and second diode-connected transistors having respective drain terminals coupled to the input node, wherein the first and second diode-connected transistors are operable to set an intermediate voltage at the input node if the input signal is open;
first and second inverting stages having respective inputs coupled to the input node, wherein the first and second inverting stages are operable to distinguish whether the input signal is low, high, and/or open;
first and second latches having respective outputs, the first latch having an input coupled to an output of the first inverting stage and the second latch having an input coupled to an output of the second inverting stage, wherein the first and second latches are operable to latch a present state of the input signal; and first and second logic gates, the first logic gate coupled between the output of the first inverting stage and the input of the first latch, and the second logic gate coupled between the output of the second inverting stage and the input of the second latch;
wherein the system is operable to cease conducting current after the present state of the input signal has been latched;
wherein the first and second logic gates are configured to prevent current flow to the first and/or second latches in case the output of the first inverting stage and/or the output of the second inverting stage is/are floating.

18. The system of claim 17, further comprising one or more of:
a first switching device having a first control input, wherein the first switching device is configured to enable the first diode-connected transistor according to the first control input;
a second switching device having a second control input, wherein the second switching device is configured to enable the second diode-connected transistor according to the second control input;
a third switching device having a third control input, wherein the third switching device is configured to enable the first inverting stage according to the third control input; and
a fourth switching device having a fourth control input, wherein the fourth switching device is configured to enable the second inverting stage according to the fourth control input.

19. The system of claim 18, wherein the first, second, third, and fourth control inputs are derived from a power-on-reset signal used to power up the system.

20. The system of claim 17, wherein the present state of the input is latched according to a control signal derived from a power-on-reset signal used to power up the system.

21. The system of claim 17, wherein the first inverting stage is configured to provide a high voltage trip point and the second inverting stage is configured to provide a low voltage trip point.

22. The system of claim 21, wherein:
if the input signal is lower than the low voltage trip point, the latched present state of the input signal is indicated by the output of the first latch being high and the output of the second latch being high;
if the input signal is open or is higher than or equal the low voltage trip point and is lower than or equal to the high voltage trip point, the latched present state of the input signal is indicated by the output of the first latch being low and the output of the second latch being high; and
if the input signal is higher than the high voltage trip point, the latched present state of the input signal is indicated by the output of the first latch being high and the output of the second latch being low.

23. The system of claim 21, wherein the first inverting stage comprises a first PMOS device and a first NMOS device, and the second inverting stage comprises a second PMOS device and a second NMOS device;
wherein the first diode-connected transistor is a third PMOS device, and the second diode-connected transistor is a third NMOS device; and
wherein the first NMOS device and the second NMOS device are each matched with the third NMOS device, and the first PMOS device and the second PMOS device are each matched with the third PMOS device, to accurately define the high voltage trip point and the low voltage trip point in relation to the intermediate voltage.

24. The system of claim 23, wherein a channel width-to-length ratio of the first NMOS device is a multiple of a channel width-to-length ratio of the third NMOS device, to drive the output of the first inverting stage low when the input node is at a voltage level that is higher than or equal the low voltage trip point and is lower than or equal to the high voltage trip point.

25. The system of claim 23, wherein a channel width-to-length ratio of the second PMOS device is a multiple of a channel width-to-length ratio of the third PMOS device, to drive the output of the second inverting stage high when the input node is at a voltage level that is higher than or equal the low voltage trip point and is lower than or equal to the high voltage trip point.

26. The system of claim 17, further comprising a third transistor having a channel terminal coupled to the input node, wherein the third transistor is configured to reduce quiescent current after the present state of the input signal has been latched.

27. The system of claim 26, wherein the third transistor has a control terminal configured to receive a first control signal, wherein the first control signal is derived from the respective outputs of the first and second latches, wherein the control signal is operable to turn on the third transistor after the present state of the input signal has been latched.

28. A system for detecting an input voltage level, the system comprising:
an input node configured to receive an input signal;
first and second diode-connected transistors having respective drain terminals coupled to the input node, wherein the first and second diode-connected transistors are operable to set an intermediate voltage at the input node if the input signal is open;
first and second inverting stages having respective inputs coupled to the input node, wherein the first and second inverting stages are operable to distinguish whether the input signal is low, high, and/or open; and
first and second latches having respective outputs, the first latch having an input coupled to an output of the first inverting stage and the second latch having an input coupled to an output of the second inverting stage, wherein the first and second latches are operable to latch a present state of the input signal;
wherein the system is operable to cease conducting current after the present state of the input signal has been latched;
wherein the first inverting stage is configured to provide a high voltage trip point and the second inverting stage is configured to provide a low voltage trip point;
wherein when the input signal is lower than the low voltage trip point, the latched present state of the input signal is indicated by the output of the first latch being high and the output of the second latch being high;
wherein when the input signal is open or is higher than or equal the low voltage trip point and is lower than or equal to the high voltage trip point, the latched present state of the input signal is indicated by the output of the first latch being low and the output of the second latch being high; and
wherein when the input signal is higher than the high voltage trip point, the latched present state of the input signal is indicated by the output of the first latch being high and the output of the second latch being low.

29. The system of claim 28, further comprising one or more of:
a first switching device having a first control input, wherein the first switching device is configured to enable the first diode-connected transistor according to the first control input;
a second switching device having a second control input, wherein the second switching device is configured to enable the second diode-connected transistor according to the second control input;
a third switching device having a third control input, wherein the third switching device is configured to enable the first inverting stage according to the third control input; and
a fourth switching device having a fourth control input, wherein the fourth switching device is configured to enable the second inverting stage according to the fourth control input.

30. The system of claim 29, wherein the first, second, third, and fourth control inputs are derived from a power-on-reset signal used to power up the system.

31. The system of claim 28, wherein the present state of the input is latched according to a control signal derived from a power-on-reset signal used to power up the system.

32. The system of claim 28, wherein the first inverting stage comprises a first PMOS device and a first NMOS device, and the second inverting stage comprises a second PMOS device and a second NMOS device;
wherein the first diode-connected transistor is a third PMOS device, and the second diode-connected transistor is a third NMOS device; and
wherein the first NMOS device and the second NMOS device are each matched with the third NMOS device, and the first PMOS device and the second PMOS device are each matched with the third PMOS device, to accurately define the high voltage trip point and the low voltage trip point in relation to the intermediate voltage.

33. The system of claim 32, wherein a channel width-to-length ratio of the first NMOS device is a multiple of a channel width-to-length ratio of the third NMOS device, to drive the output of the first inverting stage low when the input node is at a voltage level that is higher than or equal the low voltage trip point and is lower than or equal to the high voltage trip point.

34. The system of claim 32, wherein a channel width-to-length ratio of the second PMOS device is a multiple of a channel width-to-length ratio of the third PMOS device, to drive the output of the second inverting stage high when the input node is at a voltage level that is higher than or equal the low voltage trip point and is lower than or equal to the high voltage trip point.

35. The system of claim 28, further comprising a third transistor having a channel terminal coupled to the input node, wherein the third transistor is configured to reduce quiescent current after the present state of the input signal has been latched.

36. The system of claim 35, wherein the third transistor has a control terminal configured to receive a first control signal, wherein the first control signal is derived from the respective outputs of the first and second latches, wherein the control signal is operable to turn on the third transistor after the present state of the input signal has been latched.

37. A system for detecting an input voltage level, the system comprising:
an input node configured to receive an input signal;
first and second diode-connected transistors having respective drain terminals coupled to the input node, wherein the first and second diode-connected transistors are operable to set an intermediate voltage at the input node if the input signal is open;

first and second inverting stages having respective inputs coupled to the input node, wherein the first and second inverting stages are operable to distinguish whether the input signal is low, high, and/or open;

first and second latches having respective outputs, the first latch having an input coupled to an output of the first inverting stage and the second latch having an input coupled to an output of the second inverting stage, wherein the first and second latches are operable to latch a present state of the input signal;

a third transistor having a channel terminal coupled to the input node, wherein the third transistor is configured to reduce quiescent current after the present state of the input signal has been latched;

wherein the third transistor has a control terminal configured to receive a first control signal, wherein the first control signal is derived from the respective outputs of the first and second latches, wherein the control signal is operable to turn on the third transistor after the present state of the input signal has been latched; and wherein the system is operable to cease conducting current after the present state of the input signal has been latched.

38. The system of claim 37, further comprising one or more of:

a first switching device having a first control input, wherein the first switching device is configured to enable the first diode-connected transistor according to the first control input;

a second switching device having a second control input, wherein the second switching device is configured to enable the second diode-connected transistor according to the second control input;

a third switching device having a third control input, wherein the third switching device is configured to enable the first inverting stage according to the third control input; and a fourth switching device having a fourth control input, wherein the fourth switching device is configured to enable the second inverting stage according to the fourth control input.

39. The system of claim 38, wherein the first, second, third, and fourth control inputs are derived from a power-on-reset signal used to power up the system.

40. The system of claim 37, wherein the present state of the input is latched according to a control signal derived from a power-on-reset signal used to power up the system.

* * * * *